US007238919B2

(12) United States Patent
Kaneko et al.

(10) Patent No.: US 7,238,919 B2
(45) Date of Patent: Jul. 3, 2007

(54) HEATING ELEMENT MOVEMENT BONDING METHOD FOR SEMICONDUCTOR COMPONENTS

(75) Inventors: Hisashi Kaneko, Fujisawa (JP); Mie Matsuo, Kamakura (JP); Hirokazu Ezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/348,482

(22) Filed: Feb. 7, 2006

(65) Prior Publication Data

US 2006/0207985 A1   Sep. 21, 2006

(30) Foreign Application Priority Data

Mar. 15, 2005   (JP)   .......................... P2005-072651

(51) Int. Cl.
 *B23K 3/053*   (2006.01)
 *H05B 3/20*   (2006.01)
(52) U.S. Cl. .................... 219/243; 228/264; 228/230; 228/227; 228/4.1; 228/51; 219/636; 438/612; 29/878; 29/428
(58) Field of Classification Search .............. 219/243, 219/636; 438/612; 228/264, 180.22, 227, 228/230, 245, 246, 200
See application file for complete search history.

(56) References Cited

U.S. PATENT DOCUMENTS

| | | | | | |
|---|---|---|---|---|---|
| 3,850,689 | A | * | 11/1974 | Basche et al. ............... | 427/594 |
| 4,771,932 | A | * | 9/1988 | Kim ........................ | 228/180.1 |
| 4,896,019 | A | * | 1/1990 | Hyun ........................ | 219/228 |
| 6,539,618 | B1 | * | 4/2003 | Lyke ........................ | 29/762 |
| 6,967,307 | B2 | * | 11/2005 | Hembree et al. ............ | 219/209 |
| 7,075,036 | B2 | * | 7/2006 | Ogimoto et al. ............ | 219/243 |
| 2003/0019918 | A1 | * | 1/2003 | Farooq et al. ............... | 228/264 |

FOREIGN PATENT DOCUMENTS

JP   11-121531   4/1999
WO   WO 02101815 A1 *   12/2002

* cited by examiner

*Primary Examiner*—Philip H. Leung
*Assistant Examiner*—Stephen J. Ralis
(74) *Attorney, Agent, or Firm*—Finnegan, Henderson, Farabow, Garrett & Dunner, L.L.P.

(57) ABSTRACT

According to an aspect of the present invention, there is provided a bonding method, comprising disposing on a first body a second body with a bump interposed therebetween; and electrically and mechanically bonding the first body and the second body with the bump by passing a heating element between the first body and the second body to melt the bump by the heating element, the heating element being heated to a melting point or more of a material configuring the bump.

13 Claims, 4 Drawing Sheets

HEATING ELEMENT MOVEMENT BONDING METHOD FOR SEMICONDUCTOR COMPONENTS

CROSS-REFERENCE TO RELATED APPLICATIONS

This application is based upon and claims the benefit of priority from the prior Japanese Patent Application No. 2005-072651, filed on Mar. 15, 2005; the entire contents of which are incorporated herein by reference.

BACKGROUND OF THE INVENTION

1. Field of the Invention

The present invention relates to a bonding method and a bonding apparatus.

2. Description of the Related Art

In recent years, a method of bonding a semiconductor chip and a package substrate with bumps is being watched with interest as a method of high-density mounting of the semiconductor chip on the package substrate. Where the above method is used to produce a semiconductor device, a semiconductor chip and a package substrate are bonded with bumps by, for example, disposing the semiconductor chip, on which bumps are formed, on the package substrate as opposed to the package substrate and melting the bumps by heating the semiconductor chip and the package substrate.

Meanwhile, the semiconductor chip with an LSI which is highly sophisticated when miniaturized has a multilayer wiring structure, and an interlayer insulating film having a low dielectric constant and low resistance metal wiring of, for example, copper are used for the semiconductor chip. But, the interlayer insulating film having a low dielectric constant is soft with a mechanical strength (a modulus of elasticity) of 1/10 or less in comparison with that of a conventionally used Si oxide film and poor in adhesiveness with another insulating film material or metal material.

Therefore, when a semiconductor chip having a high-performance LSI is bonded to a package substrate with bumps by the above-described method, there are problems that high thermal distortion occurs at the bases of the bumps and their peripheries, and a crack or peeling of the film occurs by multilayer wiring.

Especially, a low dielectric constant interlayer insulating film material having a specific inductive capacity of less than 4.0 is also poor in adhesiveness, and the metal configuring the bumps is changed from a lead (Pb) based material to a tin (Sn) based material considering environmental problems, so that the melting point of the bump material is increased from 120 to 225° C., and the above-described problems tend to occur.

Therefore, it is essential to reduce the thermal distortion in bonding a semiconductor chip having multilayer wiring comprising a low dielectric constant interlayer insulating film and a package substrate. There is also a known method that a semiconductor chip and a package substrate are bonded with bumps by placing the semiconductor chip, on which the bumps are formed, on the heated package substrate to melt the bumps. But, it does not provide effective measures to decrease thermal distortion because the above-described large thermal distortion is caused at the bases of the bumps and their peripheries because of contraction in a package substrate cooling process.

There is also disclosed a method of bonding a semiconductor chip and a package substrate with bumps by heating contact portions between the bumps and the package substrate with infrared rays or light such as laser beams to melt the bumps while preventing heat generated from a semiconductor chip heating device from escaping to the package substrate. But, this method has a problem that it greatly depends on the layout of the bumps because light becomes difficult to reach toward the center of the semiconductor chip.

BRIEF SUMMARY OF THE INVENTION

According to an aspect of the present invention, there is provided a bonding method, comprising disposing on a first body a second body with a bump interposed therebetween; and electrically and mechanically bonding the first body and the second body with the bump by passing a heating element between the first body and the second body to melt the bump by the heating element, the heating element being heated to a melting point or more of a material configuring the bump.

According to another aspect of the present invention, there is provided a bonding apparatus, comprising a heating element configured to melt a bump interposed between a first body to be bonded and a second body to be bonded; and a moving mechanism configured to move the heating element to pass the heating element between the first body and the second body.

DETAILED DESCRIPTION OF THE INVENTION

First Embodiment

Figure 1:
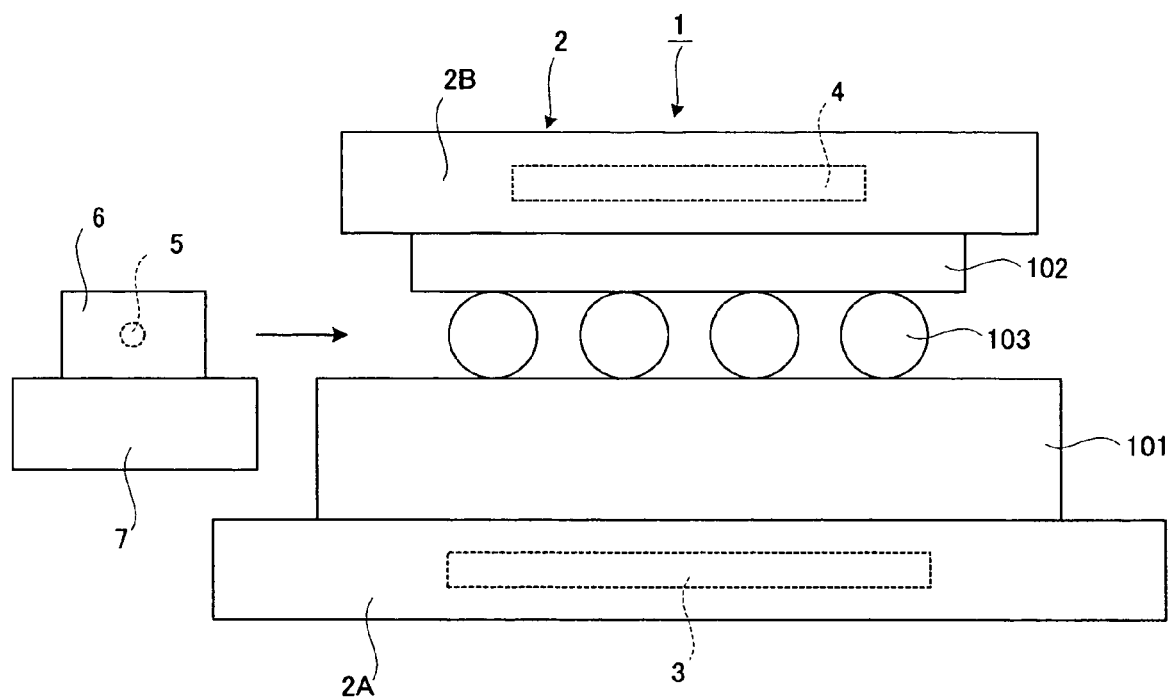
FIG. 1 is a schematic side view of the bonding apparatus according to a first embodiment.
Figure 1:
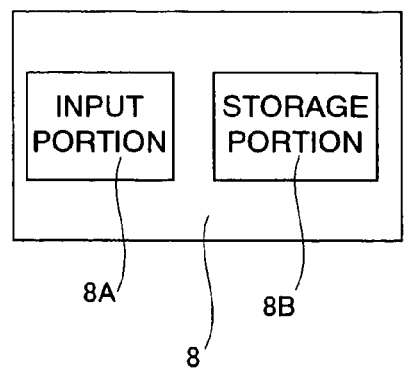

A first embodiment of the present invention will be described below. FIG. 1 is a schematic side view of the bonding apparatus according to this embodiment, FIG. 2 is a schematic plan view of the bonding apparatus according to this embodiment, FIG. 3A is a plan view schematically showing an arranged state of bumps according to this embodiment, and FIG. 3B is a graph schematically showing a moving speed and applied power of a heating wire.

Figure 2:
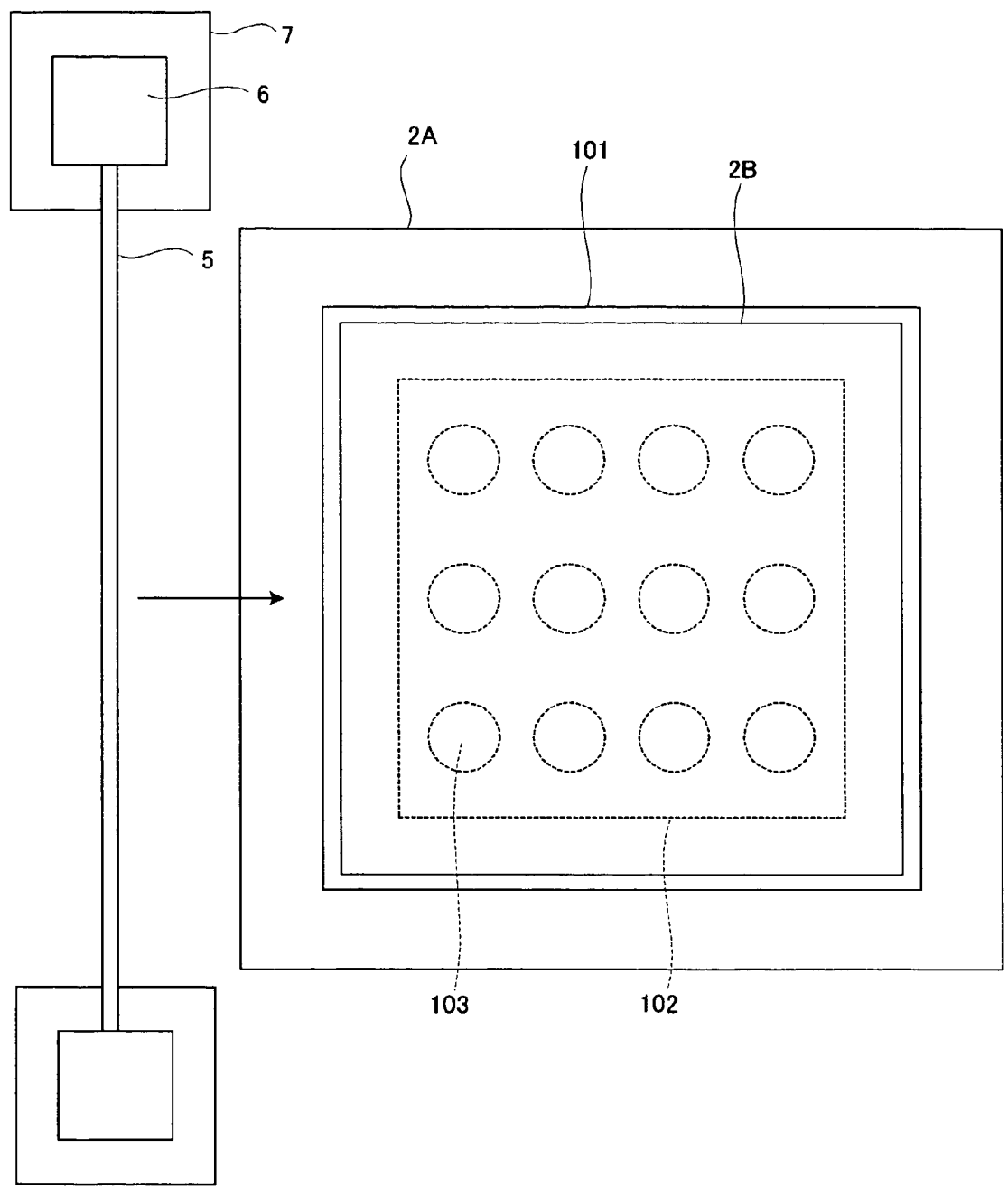
FIG. 2 is a schematic plan view of the bonding apparatus according to the first embodiment.
Figure 3A:
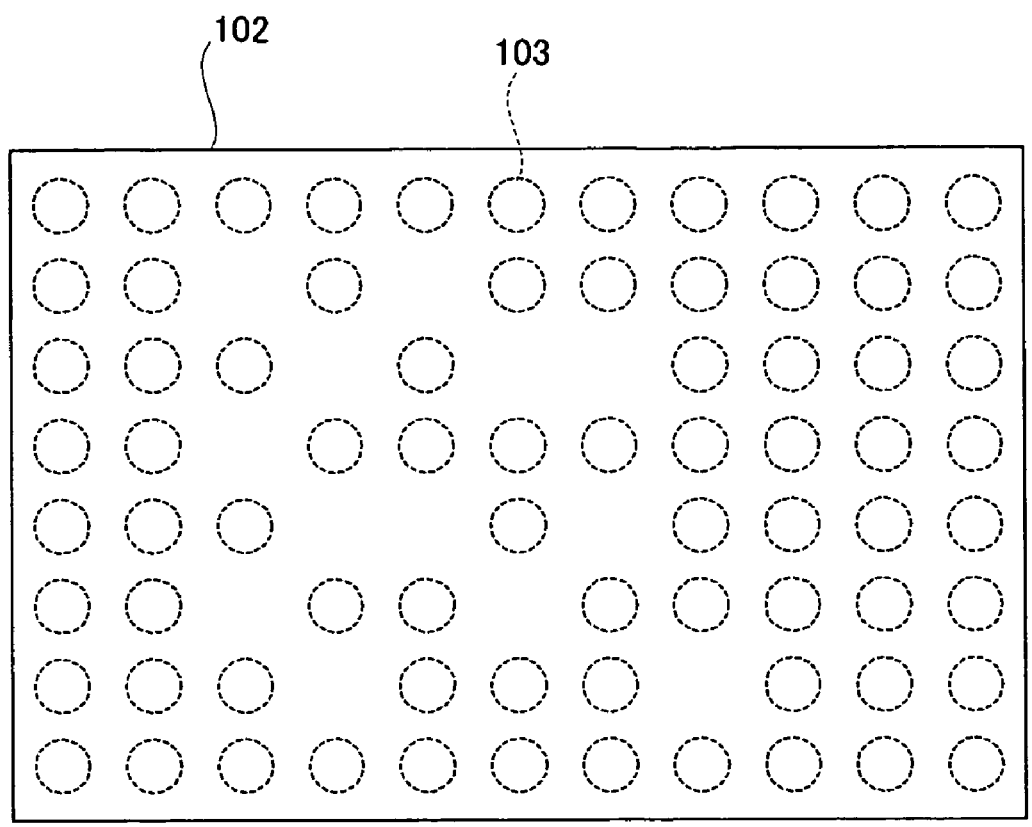
FIG. 3A is a plan view schematically showing an arranged state of bumps according to the first embodiment.
Figure 3B:
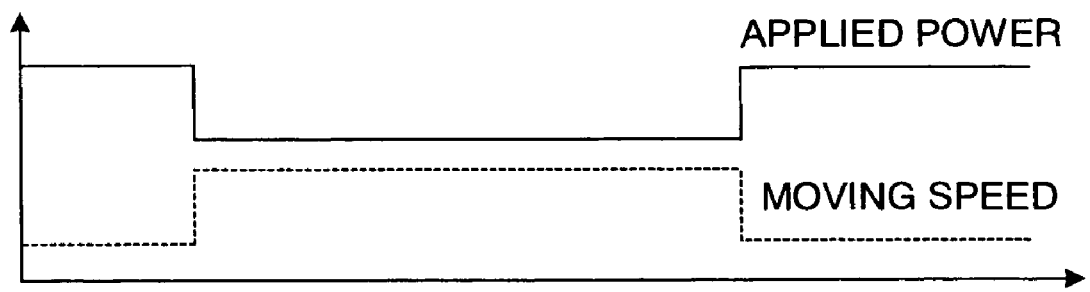
FIG. 3B is a graph schematically showing a moving speed and applied power of a heating wire.

As shown in FIG. 1 and FIG. 2, a bonding apparatus 1 is comprised of a holding mechanism 2, heating/cooling mechanisms 3, 4, a heating wire 5 as a heating element, a tensioning mechanism 6, a moving mechanism 7 and a controller 8.

The holding mechanism 2 holds bumps between a first body to be bonded and a second body to be bonded. An example of using a package substrate 101 as the first body and a semiconductor chip 102 as the second body will be described in this embodiment. The first body may be a semiconductor chip and the second body may be a semiconductor chip. And, the first body may be a mounting substrate and the second body may be a package substrate.

The package substrate 101 formed of a glass epoxy resin or AlN, and an electrode pad (not shown) is formed at a prescribed position on the surface of the package substrate 101.

The semiconductor chip 102 is configured of, for example, an Si chip and has a multilayer wiring structure comprising a low dielectric constant interlayer insulating film having a specific inductive capacity of less than 4.0 and low resistance metal wiring of copper or the like. The semiconductor chip 102 has an electrode pad (not shown), and at least one bump, and plural bumps 103 in this embodiment, are formed on the electrode pad. The bumps 103 are formed of lead-free solder such as Sn-based solder and formed into, for example, a substantially spherical shape or a cylindrical shape. FIG. 1 and FIG. 2 show the bumps 103 having a substantially spherical shape.

The bumps 103 may be formed on the package substrate 101 or may be formed independent of the package substrate 101 and the semiconductor chip 102. Where the bumps 103 are disposed independent of the package substrate 101 and the semiconductor chip 102, it is desirable that pretreatment, for example, flux coating is effected on the electrode pad of the package substrate 101 and the electrode pad of the semiconductor chip 102 to improve wettability at the time of melting the bumps.

When the bumps 103 of the semiconductor chip 102 are in contact with the electrode pad of the package substrate 101, a distance between the package substrate 101 and the semiconductor chip 102 is similar to a height of the bumps 103, for example, about 100 µm.

The holding mechanism 2 is comprised of a holding member 2A for holding the package substrate 101 and a holding member 2B which is disposed to oppose the holding member 2A and holds the semiconductor chip 102 by adsorbing. The holding member 2B is configured to be vertically movable and capable of pushing the semiconductor chip 102 against the package substrate 101 via the bumps 103.

The heating/cooling mechanisms 3, 4 heat or cool the package substrate 101 and the semiconductor chip 102 separately. The heating/cooling mechanism 3 heats or cools the package substrate 101 and is disposed on the holding member 2A. The heating/cooling mechanism 4 heats or cools the semiconductor chip 102 and is disposed on the holding member 2B. The heating/cooling mechanisms 3, 4 are configured of a heating mechanism such as a heater and a cooling mechanism such as a peltier device.

The heating wire 5 is used to melt the bumps 103 and configured to generate heat when power is applied. Specifically, the heating wire 5 is made of metal or the like such as a W wire. In this embodiment, an example of using the heating wire 5 as the heating element is described, but a heating plate may be used instead of the heating wire 5. Use of the heating plate has advantages that it has a large area to facilitate holding and is readily movable in parallel.

The heating wire 5 can be heated to a melting point or more of a material (bump material) which configures the bumps 103. The heating wire 5 is preferably heated to a temperature about 10° C. or more higher than the melting point of the bump material, but it is necessary to consider, for example, the melting point, specific heat of the bump material, the quantity of bumps and the like, in order to melt the bumps 103 smoothly. Therefore, it is desirable that an optimum temperature of the heating wire 5 is determined by, for example, conducting an experiment or simulation using the above matters as factors. To set the heating wire 5 to a temperature considerably higher than the melting point of the bump material in order to decrease a process time, it is desirable that the package substrate 101 and the semiconductor chip 102 are cooled considering a temperature rise of the package substrate 101 and the semiconductor chip 102 due to heat radiation and also generation of vapor of the bump material due to a high temperature rise of the bumps 103 when the bumps are melted.

Power applied to the heating wire 5 may be either DC power or AC power, but the heating wire 5 is desirably controlled by power. It is because there is a possibility that the resistance value of the heating wire 5 is varied substantially due to stretching of the heating wire 5 and alloying of the heating wire 5 and the bumps 103 when the process is conducted repeatedly, but what is necessary for melting the bumps 103 is power.

It is desired that the heating wire 5 has a diameter of 30 µm or less to suppress the heating wire 5 from contacting to the package substrate 101 or the semiconductor chip 102 because the distance between the package substrate 101 and the semiconductor chip 102 is about 100 µm. It is more desirable that the heating wire 5 has a diameter of 10 µm or more and 30 µm or less for convenience of application of power to the heating wire 5. Where the heating plate is used as the heating element, it is desired that the heating plate has a thickness of 30 µm or less, and preferably 10 µm or more and 30 µm or less because of the same reasons as described above. And, it is desired that the heating plate has a width smaller than the distance between the bumps 103 considering that the bumps 103 are cured immediately after melting. In other words, the heating plate has a size that the heating plate does not extend over two rows of bumps 103 when the heating plate is moved.

The heating wire 5 is desired to have oxidation resistance because there is a possibility that it is broken if it is oxidized. Examples of the heating wire 5 having oxidation resistance include a W wire plated with Au and a wire formed of an Ni alloy. If the heating wire 5 does not have oxidation resistance, it is desired that the package substrate 101 and the semiconductor chip 102 are bonded in an inert or reducing gas atmosphere. Even when the heating wire 5 has oxidation resistance, the package substrate 101 and the semiconductor chip 102 may be bonded in an inert or reducing gas atmosphere.

If the heating wire 5 has high wettability to the bump material, there is a possibility that the bumps 103 melted with the movement of the heating wire 5 expand to follow the movement of the heating wire 5, so that the heating wire 5 is desirably configured of a material having low wettability to the bump material. For the same reason, the heating wire 5 may be configured of, for example, a core wire of W or the like which is coated with a material having wettability lower than that of the core wire. Where the core wire is formed of W, for example, TiN, SiN, SiC and the like can be used as materials having wettability lower than that of the core wire. It is also possible to use other insulating materials if they have wettability lower than that of the core wire.

The tensioning mechanism 6 pulls both ends of the heating wire 5 to apply appropriate tension to the heating wire 5. Thus, sagging of the heating wire 5 can be eliminated substantially completely. Where a heating plate is used as the heating element, the tensioning mechanism 6 is not required to be disposed.

The moving mechanism 7 moves the heating wire 5 so that the heating wire 5 is passed between the package substrate 101 and the semiconductor chip 102. The moving mechanism 7 is configured to move the heating wire 5 substantially in parallel through the space between the package substrate 101 and the semiconductor chip 102.

It is necessary to determine the moving speed of the heating wire 5 considering, for example, the melting point and specific heat of the bump material and the quantity of the bumps 103. Therefore, it is desired to determine an optimum moving speed of the heating wire 5 by, for example, conducting an experiment or simulation using the above matters as factors.

The controller 8 is electrically connected to the heating/cooling mechanisms 3, 4 and the moving mechanism 7 and controls the heating/cooling mechanisms 3, 4 and the moving mechanism 7, so that the package substrate 101 and the semiconductor chip 102 have a desired temperature, and the heating wire 5 has a desired moving speed. The controller 8 is configured to control the heating/cooling mechanisms 3, 4 and the moving mechanism 7 and also to control the operation of the bonding apparatus 1 as a whole.

Here, if the arranged density of the bumps 103 is different by location as shown in FIG. 3A, it is desirable that the moving speed of the heating wire 5 or the power applied to the heating wire 5 is varied in conformity with the arranged density. Specifically, the moving speed of the heating wire 5 is decreased or the power applied to the heating wire 5 is increased at the position where the arranged density of the bumps 103 is high as shown in FIG. 3B. And, the moving speed of the heating wire 5 is increased or the power applied to the heating wire 5 is decreased at a position where the arranged density of the bumps 103 is low.

The controller 8 is provided with an input portion 8A and a storage portion 8B and configured to control the heating/cooling mechanisms 3, 4 and the moving mechanism 7 according to information input to the input portion 8A. The input portion 8A is configured to allow input of the temperatures of the package substrate 101 and the semiconductor chip 102, the moving speed of the heating wire 5, the temperature of the heating wire 5, the power applied to the heating wire 5 and the layout of the bumps 103.

The storage portion 8B stores information which associates various layouts of the bumps 103 with the moving speed of the heating wire 5 or the power applied to the heating wire 5. Specifically, the moving speed of the heating wire 5 or the power applied to the heating wire 5 which is suitable for every layout of the bumps 103 is determined in advance by an experiment or simulation, and the obtained information is stored in the storage portion 8B. Because the obtained information is stored in the storage portion 8B, the layout of the bumps 103 is input to the input portion 8A, the moving speed of the heating wire 5 or the power applied to the heating wire 5 suitable for the input layout of the bumps 103 is read from the storage portion 8B, and the moving mechanism 7 and the power applied to the heating wire 5 can be controlled by the controller 8 according to the read moving speed or applied power. Even if there is a difference in the arranged density of the bumps 103 by location as described above, the moving speed of the heating wire 5 and the power applied to the heating wire 5 can be varied in conformity with the arranged density of the bumps 103 by simply inputting the layout of the bumps 103 when the layout having a difference in the arranged density of the bumps 103 and the moving speed of the heating wire 5 and the power applied to the heating wire 5 which are varied depending on the arranged density are stored in the storage portion 8B.

Figure 4A:
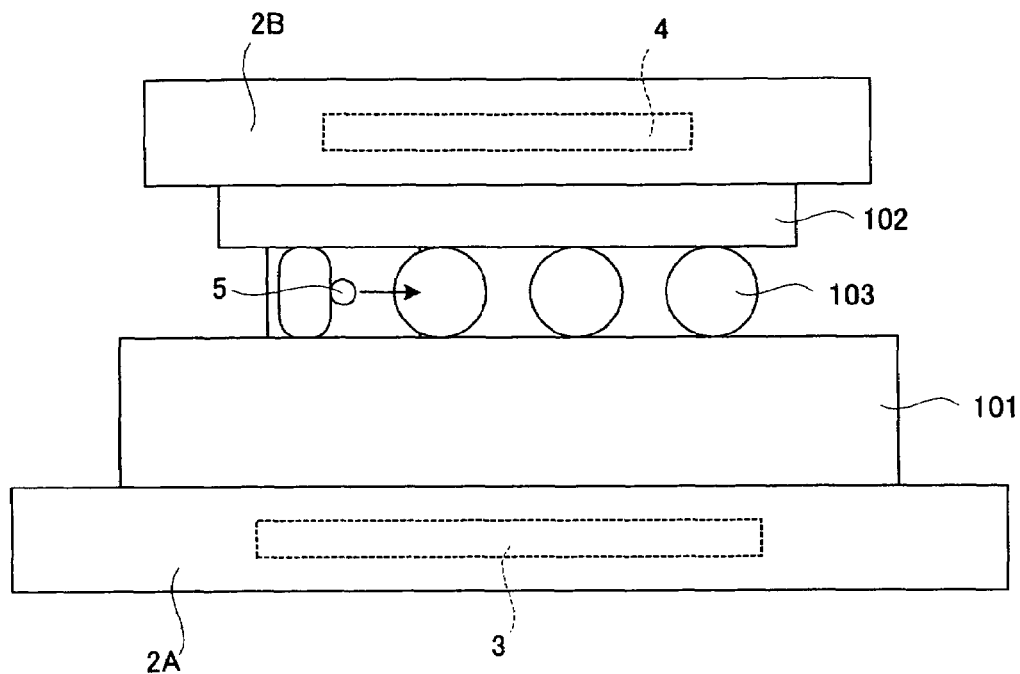
FIG. 4A and FIG. 4B are diagrams schematically showing a state of bonding a package substrate and a semiconductor chip according to the first embodiment.
Figure 4B:
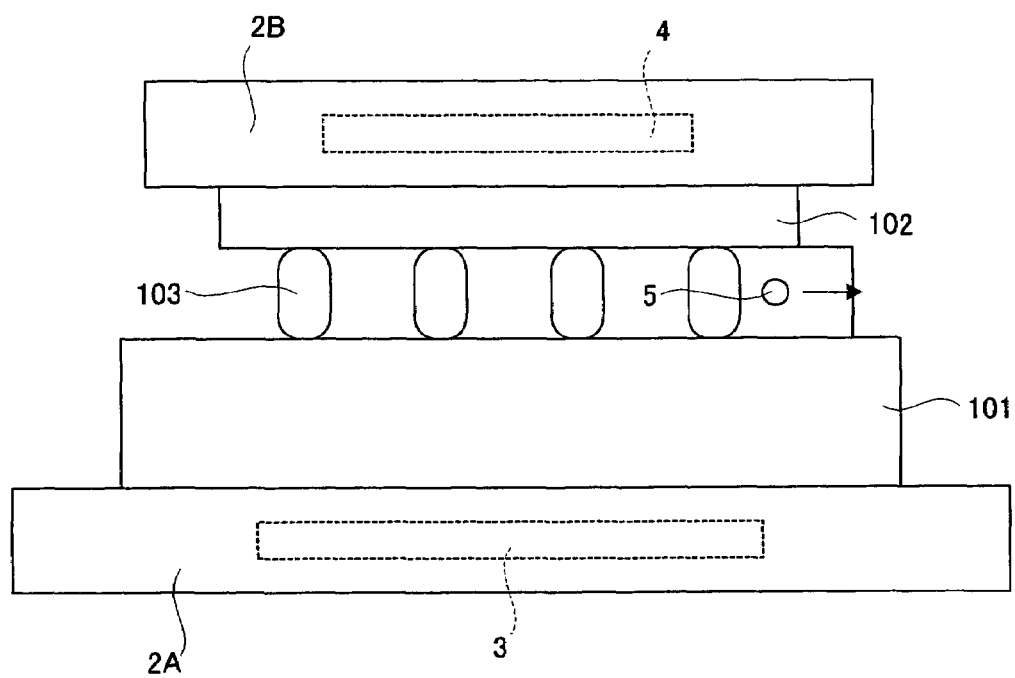

Bonding of the package substrate 101 and the semiconductor chip 102 will be described in detail below. FIG. 4A and FIG. 4B are diagrams schematically showing a state of bonding a package substrate and a semiconductor chip according to this embodiment.

First, the temperatures and the like of the package substrate 101 and the semiconductor chip 102 are input to the input portion 8A. In this embodiment, an example of inputting temperatures, to which the package substrate 101 and the semiconductor chip 102 are cooled at the time of bonding, to the input portion 8A will be described. When they are input to the input portion 8A, the package substrate 101 and the semiconductor chip 102 are cooled by the heating/cooling mechanisms 3, 4, and the heating wire 5 is heated to a desired temperature under control by the controller 8 according to the input information.

Then, the package substrate 101 is held by the holding member 2A and the semiconductor chip 102 on which the bumps 103 are formed is adsorbed and held by the holding member 2B. The semiconductor chip 102 is aligned so that the bumps 103 are disposed on the electrode pad of the package substrate 101, the holding member 2B is lowered to contact the bumps 103 with the electrode pad of the package substrate 101. Thus, the semiconductor chip 102 is placed on the package substrate 101 with the bumps 103 therebetween.

Then, as shown in FIG. 4A, the heating wire 5 is moved to pass between the package substrate 101 and the semiconductor chip 102 with the heating wire 5 appropriately tensioned by the tensioning mechanism 6. Here, the moving speed of the heating wire 5 is controlled by the controller 8. When the heating wire 5 comes into contact with the bumps 103, the bumps 103 are heated and melted by heat generated from the heating wire 5. The heating wire 5 is moved through the bumps 103 because it is moved while melting the bumps 103. Thus, the temperature of the bumps 103 drops sharply, so that the bumps 103 cure immediately, and the package substrate 101 and the semiconductor chip 102 are mutually bonded with the bumps 103. And, the bumps 103 are melted and cured successively, so that the package substrate 101 and the semiconductor chip 102 are bonded with the bumps 103 as a whole.

In this embodiment, the heating wire 5 which is heated to the melting point or more of the material configuring the bumps 103 is passed between the package substrate 101 and the semiconductor chip 102 to melt the bumps 103 by the heating wire 5. Thus, the bumps 103 can be melted regardless of the layout of the bumps 103. And, the package substrate 101 and the semiconductor chip 102 can be electrically and mechanically bonded with the bumps 103 without heating the package substrate 101 and the semiconductor chip 102. Therefore, thermal distortion which is generated in the bumps 103 and the vicinity of the bumps 103 at the time of bonding can be decreased, and a highly reliable semiconductor device can be provided.

In this embodiment, the heating wire 5 is passed between the package substrate 101 and the semiconductor chip 102 while cooling the package substrate 101 and the semiconductor chip 102, so that a temperature rise of the package substrate 101 and the semiconductor chip 102 due to heat radiation can be suppressed. The temperature rise of the package substrate 101 and the semiconductor chip 102 due to the heat radiation tends to occur readily when the moving speed of the heating wire 5 is low or the power applied to the heating wire 5 is high. Even in such a case, a temperature rise of the package substrate 101 and the semiconductor chip 102 can be suppressed by cooling the package substrate 101 and the semiconductor chip 102 in this embodiment.

In this embodiment, the heating wire 5 is moved through the space between the package substrate 101 and the semiconductor chip 102 with the appropriate tension applied to the heating wire 5. Therefore, the heating wire 5 can be prevented from contacting to the package substrate 101 or the semiconductor chip 102. Thus, an increase in temperature of the package substrate 101 and the semiconductor chip 102 due to the contact of the heating wire 5 to the package substrate 101 or the semiconductor chip 102 can be prevented.

In this embodiment, bonding can be effected with at least either the moving speed of the heating wire 5 or the power applied to the heating wire 5 varied according to the arranged density of the bumps 103, so that appropriate heat quantity can be applied uniformly to all the bumps 103 even if there is a difference in the arranged density of the bumps 103 by location. In other words, where the moving speed of the heating wire 5 is constant or the power applied to the heating wire 5 is constant, heat quantity applied to one bump decreases at a position where the arranged density of the bumps 103 is high, an increase in temperature of the bumps 103 is hard, and it is difficult to melt the bumps 103. Meanwhile, heat quantity applied to one bump becomes high at a position where the arranged density of the bumps 103 is low, and the temperature of the bumps 103 rises sharply, resulting in a possibility that vapor of the bump material is generated. Meanwhile, in this embodiment, the moving speed of the heating wire 5 can be decreased or the power applied to the heating wire 5 can be increased at a position where the arranged density of the bumps 103 is high, so that heat quantity applied to one bump can be increased. And, the moving speed of the heating wire 5 can be increased or the power applied to the heating wire 5 can be decreased at a position where the arranged density of the bumps 103 is low, so that the heat quantity applied to one bump can be decreased. Thus, appropriate heat quantity can be applied uniformly to all the bumps 103.

Second Embodiment

A second embodiment will be described below. In this embodiment, an example of passing a heating wire between a package substrate and a semiconductor chip while keeping the package substrate and the semiconductor chip at a temperature at which the semiconductor chip operates will be described.

First, temperatures of the package substrate 101 and the semiconductor chip 102 are input to the input portion 8A. Here, the temperature of the package substrate 101 is input in a range of 60 to 70° C. because the package substrate 101 has a temperature of 60 to 70° C. when the semiconductor chip 102 operates. The temperature of the semiconductor chip 102 is input in a range of 85 to 150° C. because the semiconductor chip 102 has a temperature of 85 to 150° C. when the semiconductor chip 102 operates. When such temperatures are input to the input portion 8A, the controller 8 controls the heating/cooling mechanisms 3, 4 according to the input information, the package substrate 101 is kept at 60 to 70° C., and the semiconductor chip 102 is kept at 85 to 150° C.

Then, under the conditions as described above, the semiconductor chip 102 is aligned in the same manner as in the above-described embodiment, and the semiconductor chip 102 is placed on the package substrate 101 with the bumps 103 interposed therebetween.

Then, the heating wire 5 is moved to melt the bumps 103 by passing it between the semiconductor chip 102 and the package substrate 101 with a prescribed degree of tension applied to the heating wire 5 by the tensioning mechanism 6.

In this embodiment, the heating wire 5 is passed between the package substrate 101 and the semiconductor chip 102 while keeping the package substrate 101 and the semiconductor chip 102 at temperatures at which the semiconductor chip 102 operates, so that thermal distortion generated in the bumps 103 and the vicinity of the bumps 103 at the time of operation of the semiconductor chip 102 can be decreased.

It is to be noted that the present invention is not limited to the described embodiments and the structure, material, arrangement of individual members and the like may be changed and modified appropriately without departing from the scope of the present invention. In the first embodiment, the heating wire 5 is passed between the package substrate 101 and the semiconductor chip 102 while cooling the package substrate 101 and the semiconductor chip 102, but the package substrate 101 and the semiconductor chip 102 may not be cooled.

What is claimed is:

1. A bonding method, comprising:
disposing on a first body a second body with bumps interposed therebetween; and
electrically and mechanically bonding the first body and the second body with the bumps by passing a heating element between the first body and the second body to melt the bumps by the heating element, the heating element being heated to a melting point or more of a material configuring the bumps,
wherein the heating element generates heat when power is applied, and the first body and the second body are electrically and mechanically bonded with the bumps while varying at least either a moving speed of the heating element according to an arranged density of the bumps or the power applied to the heating element according to the arranged density of the bumps.

2. The bonding method according to claim 1,
wherein the first body and the second body are electrically and mechanically bonded with the bumps while cooling the first body and the second body.

3. The bonding method according to claim 1,
wherein at least either the first body or the second body is a semiconductor chip, and the first body and the second body are electrically and mechanically bonded with the bumps while keeping the first body and the second body at each temperature range at which the semiconductor chip operates.

4. The bonding method according to claim 1,
wherein the heating element is formed to have a linear shape, and the first body and the second body are electrically and mechanically bonded with the bumps while applying tension to the heating element.

5. The bonding method according to claim 1,
wherein the first body is a package substrate and the second body is a semiconductor chip, or both the first body and the second body are semiconductor chips, or the first body is a mounting substrate and the second body is a package substrate.

6. The boding method according to claim 1,
wherein the bumps are disposed on the first body or disposed independent of the first body and the second body.

7. The bonding method according to claim 1,
wherein the heating element is heated to a temperature 10° C. or more higher than the melting point of a material configuring the bumps.

8. The bonding method according to claim 1,
wherein the heating element is a heating wire or a heating plate.

9. The bonding method according to claim 8,
wherein a diameter of the heating wire or a thickness of the heating plate is 30 μm or less.

10. The bonding method according to claim 9,
wherein a diameter of the heating wire or a thickness of the heating plate is 10 μm or more.

11. The bonding method according to claim 8,
wherein the heating wire is comprised of a core wire and a material which is coated on the core wire and has wettability to the material configuring the bumps lower than that of the core wire.

12. The bonding method according to claim 8,
wherein the heating wire has oxidation resistance.

13. The bonding method according to claim 1,
wherein the first body and the second body are electrically and mechanically bonded with the bumps in an inert and reducing gas atmosphere.

* * * * *

UNITED STATES PATENT AND TRADEMARK OFFICE
CERTIFICATE OF CORRECTION

PATENT NO.       : 7,238,919 B2
APPLICATION NO.  : 11/348482
DATED            : July 3, 2007
INVENTOR(S)      : Kaneko et al.

Page 1 of 1

It is certified that error appears in the above-identified patent and that said Letters Patent is hereby corrected as shown below:

Claim 6, column 8, line 57, change "boding" to --bonding--.

Signed and Sealed this

Twentieth Day of May, 2008

JON W. DUDAS
*Director of the United States Patent and Trademark Office*